(12) United States Patent
Fukasawa

(10) Patent No.: US 11,195,880 B2
(45) Date of Patent: Dec. 7, 2021

(54) DISPLAY APPARATUS AND MANUFACTURING METHOD THEREOF

(71) Applicant: Samsung Display Co., Ltd., Yongin-si (KR)

(72) Inventor: Takayuki Fukasawa, Seoul (KR)

(73) Assignee: Samsung Display Co., Ltd., Yongin-si (KR)

(*) Notice: Subject to any disclaimer, the term of this patent is extended or adjusted under 35 U.S.C. 154(b) by 0 days.

(21) Appl. No.: 16/744,106

(22) Filed: Jan. 15, 2020

(65) Prior Publication Data

US 2020/0235170 A1 Jul. 23, 2020

(30) Foreign Application Priority Data

Jan. 18, 2019 (KR) .................. 10-2019-0006956

(51) Int. Cl.
| | |
|---|---|
| H01L 27/32 | (2006.01) |
| H01L 25/04 | (2014.01) |
| H01L 25/16 | (2006.01) |
| H01L 51/56 | (2006.01) |
| H01L 51/00 | (2006.01) |

(52) U.S. Cl.
CPC ........ *H01L 27/3209* (2013.01); *H01L 25/048* (2013.01); *H01L 25/167* (2013.01); *H01L 51/56* (2013.01); *H01L 51/003* (2013.01); *H01L 51/0015* (2013.01)

(58) Field of Classification Search
None
See application file for complete search history.

(56) References Cited

U.S. PATENT DOCUMENTS

| | | | |
|---|---|---|---|
| 6,368,730 B1* | 4/2002 | Kishimoto | .......... H01L 51/5206 313/502 |
| 8,338,222 B2 | 12/2012 | Kim et al. | |
| 9,755,175 B2* | 9/2017 | Wang | .................. G09G 3/3225 |
| 10,236,467 B2 | 3/2019 | Park et al. | |
| 2012/0223346 A1 | 9/2012 | Ohsawa et al. | |
| 2017/0338250 A1 | 11/2017 | Yanaka et al. | |
| 2017/0345802 A1 | 11/2017 | Sung et al. | |
| 2017/0373036 A1 | 12/2017 | Yamazaki et al. | |

(Continued)

FOREIGN PATENT DOCUMENTS

| | | |
|---|---|---|
| JP | 2005-235742 A | 9/2005 |
| KR | 10-2018-0061612 A | 6/2018 |
| KR | 10-1968527 B1 | 4/2019 |

*Primary Examiner* — J. E. Schoenholtz
(74) *Attorney, Agent, or Firm* — Lewis Roca Rothgerber Christie LLP

(57) ABSTRACT

A display apparatus includes a substrate comprising a first pixel region and a second pixel region adjacent to the first pixel region; a circuit device layer on the substrate; a first light-emitting device module on the circuit device layer, the first light-emitting device module comprising a first light-emitting device overlapping the first pixel region to display a first color; and a second light-emitting device module on the first light-emitting device module, the second light-emitting device module having a first pixel penetration hole overlapping the first pixel region, the second light-emitting device module further comprising a second light-emitting device overlapping the second pixel region to display a second color different from the first color.

20 Claims, 15 Drawing Sheets

(56) References Cited

U.S. PATENT DOCUMENTS

2018/0247986 A1  8/2018 Maeda
2020/0161576 A1* 5/2020 Hsu ..................... H01L 27/3209
2021/0143367 A1* 5/2021 Ichikawa .............. H01L 27/322

* cited by examiner

DISPLAY APPARATUS AND MANUFACTURING METHOD THEREOF

CROSS-REFERENCE TO RELATED APPLICATIONS

This application claims priority to and the benefit of Korean Patent Application No. 10-2019-0006956, filed on Jan. 18, 2019, in the Korean Intellectual Property Office, the entire content of which is hereby incorporated by reference.

BACKGROUND

1. Field

The present disclosure relates to a display apparatus and a method of manufacturing the same, and in particular, to a high-resolution display apparatus and a method of manufacturing the same.

2. Description of the Related Art

An organic light emitting display apparatus, among display apparatuses, is emerging as a next-generation display apparatus, because it has various technical features, such as a large viewing angle, a good contrast property, and a fast response speed.

In general, the organic light emitting display apparatus includes thin film transistors and organic light emitting devices, which are located on a substrate. Each of the organic light emitting devices serving as a self-luminescent device includes a pixel electrode, an opposite electrode opposite to the pixel electrode, and a light-emitting layer between the pixel electrode and the opposite electrode. The organic light emitting display apparatus is used as a display unit of a small-size product, such as a mobile phone or as a display unit of a large-sized product, such as a television set.

In the case of a full-color-displaying organic light emitting display apparatus, pixel regions emit lights of different colors, and a deposition mask is used to form a light-emitting layer in each pixel and an opposite electrode, each of which are provided as a single object in a plurality of pixels. As resolution of an organic light emitting display apparatus increases, a width of an open slit of a mask, which is used for a deposition process, decreases, and it is desirable to reduce its dispersion. To manufacture a high-resolution organic light emitting display apparatus, it is desirable to reduce or remove a shadow effect.

However, there is an increasing difficulty in realizing a high-resolution organic light emitting display apparatus through the deposition process using the mask.

SUMMARY

An embodiment of the present disclosure provides a high-resolution organic light emitting display apparatus.

According to some embodiments of the present disclosure, a display apparatus includes a substrate including a first pixel region and a second pixel region adjacent to the first pixel region; a circuit device layer on the substrate; a first light-emitting device module on the circuit device layer, the first light-emitting device module including a first light-emitting device overlapping the first pixel region to display a first color; and a second light-emitting device module on the first light-emitting device module, the second light-emitting device module having a first pixel penetration hole overlapping the first pixel region, the second light-emitting device module further including a second light-emitting device overlapping the second pixel region to display a second color different from the first color.

In some embodiments, the first light-emitting device includes a first pixel electrode, a first opposite electrode opposite to the first pixel electrode, and a first light-emitting layer between the first pixel electrode and the first opposite electrode, the first light-emitting device module further includes a first non-emission layer not overlapping the first pixel region, and wherein the first non-emission layer and the first light-emitting layer constitute a single object.

In some embodiments, the first non-emission layer includes a first material different from a second material of the first light-emitting layer. In some embodiments, a first material included in the first non-emission layer and a second material included in the first light-emitting layer have molecular structures that are different from each other. In some embodiments, the first non-emission layer encloses the first light-emitting layer, when viewed in a plan view. In some embodiments, the first light-emitting device further includes a first protection layer, the first protection layer being located on the first opposite electrode and including an insulating material.

In some embodiments, a second pixel penetration hole overlapping the second pixel region is in the first light-emitting device module. In some embodiments, the first light-emitting device module further includes a first substrate located below the first light-emitting device to support the first light-emitting device, wherein the second pixel penetration hole penetrates the first substrate. In some embodiments, the first non-emission layer overlaps the second pixel region. In some embodiments, the circuit device layer includes a transistor connected to the first light-emitting device module, and the first pixel electrode is connected to the transistor through a pixel contact hole, the pixel contact hole being located outside the first pixel region and penetrating the first light-emitting device module and the second light-emitting device module.

In some embodiments, the circuit device layer includes a power voltage pattern configured to receive a reference voltage, wherein the first opposite electrode is connected to the power voltage pattern through an opposite contact hole, the opposite contact hole being located outside the first pixel region and penetrating the first light-emitting device module and the second light-emitting device module. In some embodiments, the second light-emitting device module further includes a second substrate below the second light-emitting device to support the second light-emitting device, wherein the first pixel penetration hole penetrates the second substrate.

In some embodiments, a display apparatus includes a substrate including a first pixel region and a margin region adjacent to the first pixel region; a circuit device layer on the substrate; and a first light-emitting device module on the circuit device layer, the first light-emitting device module including a first light-emitting device overlapping the first pixel region to display a first color, the first light-emitting device module further including a first non-emission layer overlapping the margin region, wherein the first light-emitting device includes a first pixel electrode, a first opposite electrode opposite to the first pixel electrode, and a first light-emitting layer between the first pixel electrode and the first opposite electrode, and wherein the first non-emission layer and the first light-emitting layer constitute a single object.

In some embodiments, the first non-emission layer includes a first material different from a second material of the first light-emitting layer. In some embodiments, a first material included in the first non-emission layer and a second material included in the first light-emitting layer have molecular structures that are different from each other. In some embodiments, the substrate further includes a second pixel region spaced from the first pixel region, the display apparatus further includes a second light-emitting device module on the first light-emitting device module, the second light-emitting device module includes a second light-emitting device overlapping the second pixel region and configured to display a second color different from the first color, and the second light-emitting device module has a first pixel penetration hole overlapping the first pixel region.

In some embodiments, a method of manufacturing a display apparatus includes placing a substrate including a first pixel region and a second pixel region adjacent to the first pixel region, on a support substrate; forming a penetration hole, overlapping the second pixel region, in the substrate; forming a first pixel electrode on the substrate; depositing a light-emitting pattern on the first pixel electrode; irradiating a first light onto a portion of the light-emitting pattern to form a first light-emitting layer, the portion of the light-emitting pattern not overlapping the first pixel region, the first light-emitting layer overlapping the first pixel region, and a first non-emission layer not overlapping the first pixel region; forming a first opposite electrode on the first light-emitting layer and the first non-emission layer; and separating the support substrate from the substrate.

In some embodiments, the first light has a wavelength of 300 nm or shorter. In some embodiments, a molecular structure of a second material in the first light-emitting layer is different from a molecular structure of a first material in the first non-emission layer. In some embodiments, the forming of the penetration hole in the substrate includes irradiating the substrate with a laser beam, using a dry etching process, or using a Bosch process.

BRIEF DESCRIPTION OF THE DRAWINGS

Example embodiments will be more clearly understood from the following brief description taken in conjunction with the accompanying drawings. The accompanying drawings represent non-limiting, example embodiments as described herein.

Figure 1:
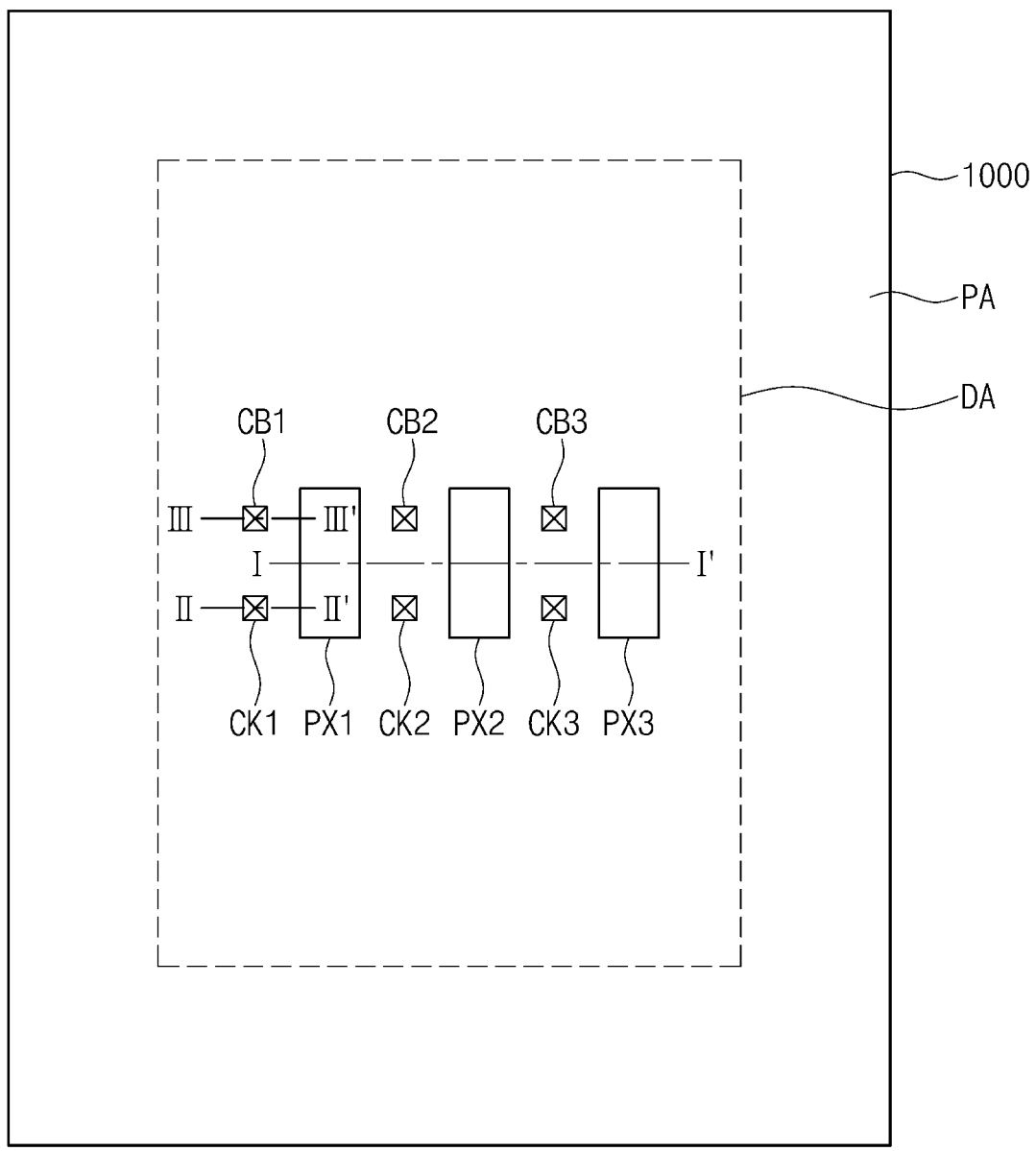
FIG. 1 is a plan view schematically illustrating a display apparatus according to an embodiment of the present disclosure.

It should be noted that these figures are intended to illustrate the general characteristics of methods, structure and/or materials utilized in certain example embodiments and to supplement the written description provided below. These drawings are not, however, to scale and may not precisely reflect the precise structural or performance characteristics of any given embodiment, and should not be interpreted as defining or limiting the range of values or properties encompassed by example embodiments. For example, the relative thicknesses and positioning of molecules, layers, regions and/or structural elements may be reduced or exaggerated for clarity. The use of similar or identical reference numbers in the various drawings is intended to indicate the presence of a similar or identical element or feature.

DETAILED DESCRIPTION

Example embodiments of the present disclosure will now be described more fully with reference to the accompanying drawings, in which example embodiments are shown. Example embodiments of the present disclosure may, however, be embodied in many different forms and should not be construed as being limited to the embodiments set forth herein; rather, these embodiments are provided so that this disclosure will be thorough and complete, and will fully convey the concept of example embodiments to those of ordinary skill in the art. In the drawings, the thicknesses of layers and regions are exaggerated for clarity. Like reference numerals in the drawings denote like elements, and thus their description will be omitted.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Like numbers indicate like elements throughout. As used herein the term "and/or" includes any and all combinations of one or more of the associated listed items. Other words used to describe the relationship between elements or layers should be interpreted in a like fashion (e.g., "between" versus "directly between," "adjacent" versus "directly adjacent," "on" versus "directly on").

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises", "comprising", "includes" and/or "including," if used herein, specify the presence of stated features, integers, steps, operations, elements and/or components, but do not preclude the presence or addition of one or more other features, integers, steps, operations, elements, components and/or groups thereof.

Example embodiments of the present disclosure are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments of the present disclosure should not be construed as limited to the particular shapes of regions illustrated herein but are to include deviations in shapes that result, for example, from manufacturing.

Unless otherwise defined, all terms (including technical and scientific terms) used herein have the same meaning as commonly understood by one of ordinary skill in the art to which example embodiments of the present disclosure belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

FIG. 1 is a plan view schematically illustrating a display apparatus according to an embodiment of the present disclosure.

As shown in FIG. 1, a display apparatus 1000 may include a display region DA, which is used to display an image, and a peripheral region PA, which is located outside the display region DA.

In an embodiment, the display apparatus 1000 is illustrated as having a rectangular shape, when viewed in a plan view. An extension direction of a long side of the display apparatus 1000 may be defined as a first direction DR1, and an extension direction of a short side of the display apparatus 1000 may be defined as a second direction DR2. A thickness direction of the display apparatus 1000 may be defined as a third direction DR3.

Pixels for emitting lights of different colors may be in the display region DA. First to third pixels PX1, PX2, and PX3 are illustrated in FIG. 1. The first to third pixels PX1, PX2, and PX3 may display different colors. For example, the first to third pixels PX1, PX2, and PX3 may emit red, green, and blue lights, respectively. Although, FIG. 1 illustrates an example in which the first to third pixels PX1, PX2, and PX3 are sequentially arranged along the second direction DR2, the present disclosure is not limited to this example and the arrangement of the pixels may be variously changed.

In FIG. 1, the first to third pixels PX1, PX2, and PX3 may be in the display region DA and may be repeatedly arranged along the first and second directions DR1 and DR2. Opposite contact holes CB1, CB2, and CB3, and pixel contact holes CK1, CK2, and CK3, are also arranged in the display region DA.

A driver, a power voltage supplying line, and so forth for providing an electrical signal or power to pixels may be in the peripheral region PA, which is a non-display region. In an embodiment, the peripheral region PA may further include a pad, which is a region electrically connected with an electronic device, a printed circuit board, and so forth.

Figure 2:
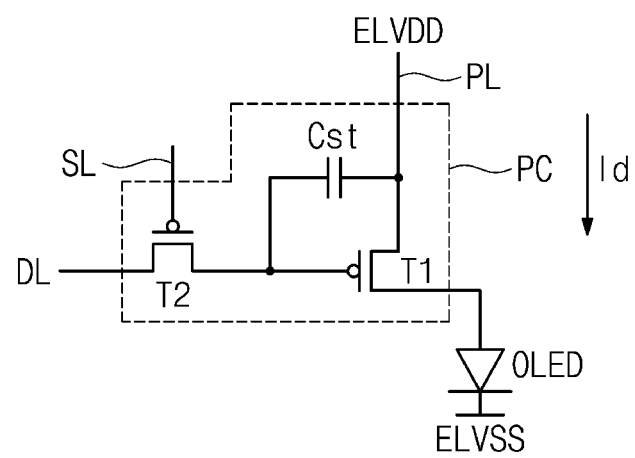
FIG. 2 is an equivalent circuit diagram of one of the pixels constituting a display apparatus according to an embodiment of the present disclosure.

FIG. 2 is an equivalent circuit diagram of one of the pixels constituting a display apparatus according to an embodiment of the present disclosure.

Referring to FIG. 2, the pixel may include a pixel circuit PC and a display element connected to the pixel circuit PC. In FIG. 2, an organic light emitting diode OLED is illustrated as an example of the display element. The pixel circuit PC may include a first thin film transistor T1, a second thin film transistor T2, and a storage capacitor Cst.

The second thin film transistor T2 serving as a switching transistor may be connected to a scan line SL and a data line DL and may transmit a data voltage input from the data line DL to the first thin film transistor T1, depending on a switching voltage input from the scan line SL. The storage capacitor Cst may be connected between the second thin film transistor T2 and a driving voltage line PL, and may store a voltage corresponding to a difference between a voltage transmitted from the second thin film transistor T2 and a first power voltage ELVDD supplied to the driving voltage line PL.

The first thin film transistor T1 serving as a driving transistor may be connected to the driving voltage line PL and the storage capacitor Cst and may control a driving current Id, which flows from the driving voltage line PL to the organic light emitting diode OLED, depending on a level of the voltage stored in the storage capacitor Cst. The organic light emitting diode OLED may emit light, whose brightness is determined by the driving current Id. An opposite electrode (e.g., a cathode) of the organic light emitting diode OLED may be supplied with a second power voltage ELVSS.

FIG. 2 illustrates an example of the pixel circuit PC including two thin film transistors and one storage capacitor, but the present disclosure is not limited to this example. The number of the thin film transistors and the storage capacitor may be variously changed, according to a designed structure of the pixel circuit PC.

Figure 3:
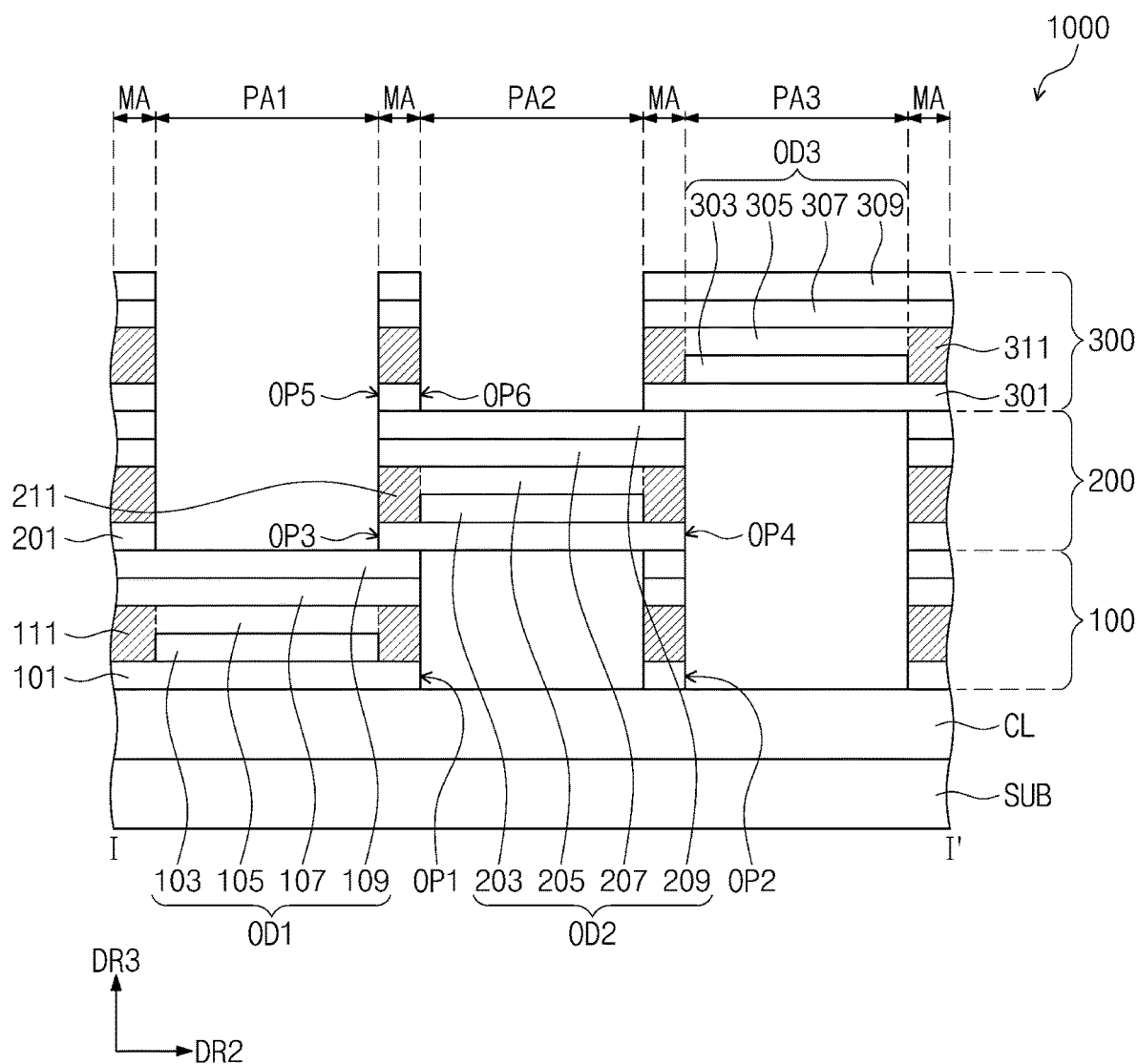
FIG. 3 is a sectional view taken along the line I-I' of FIG. 1.

FIG. 3 is a sectional view taken along the line I-I' of FIG. 1, and FIGS. 4A-4C are plan views illustrating first to third light-emitting device modules, respectively.

The display apparatus 1000 may include a base layer SUB, a circuit device layer CL, a first light-emitting device module 100, a second light-emitting device module 200, and a third light-emitting device module 300.

In an embodiment, the display region DA of the display apparatus 1000 may include a first pixel region PA1, a second pixel region PA2, a third pixel region PA3, and a plurality of margin regions MA. In an embodiment, the first pixel PX1 may include a portion of the first light-emitting device module 100 and some elements of the circuit device layer CL, which are overlapped with the first pixel region PA1. Similarly, the second pixel PX2 may include a portion of the second light-emitting device module 200 and some elements of the circuit device layer CL, which are overlapped with the second pixel region PA2, and the third pixel PX3 may include a portion of the third light-emitting device module 300 and some elements of the circuit device layer CL, which are overlapped with the third pixel region PA3.

The base layer SUB may include at least one of polymer resins, such as polyether sulfone (PES), polyacrylate (PAR), polyether imide (PEI), polyethylene naphthalate (PEN), polyethylene terephthalate (PET), polyphenylene sulfide (PPS), polyarylate (PAR), polyimide (PI), polycarbonate (PC), or cellulose acetate propionate (CAP).

The circuit device layer CL may be located on the base layer SUB. The circuit device layer CL may include a circuit device and at least one insulating layer. The circuit device may include signal lines, a pixel driving circuit, and so forth. The signal lines may include the scan line SL, the data line DL, the driving voltage line PL described with reference to FIG. 2. The pixel driving circuit may include the first thin film transistor T1, the second thin film transistor T2, and the storage capacitor Cst described with reference to FIG. 2.

Figure 4A:
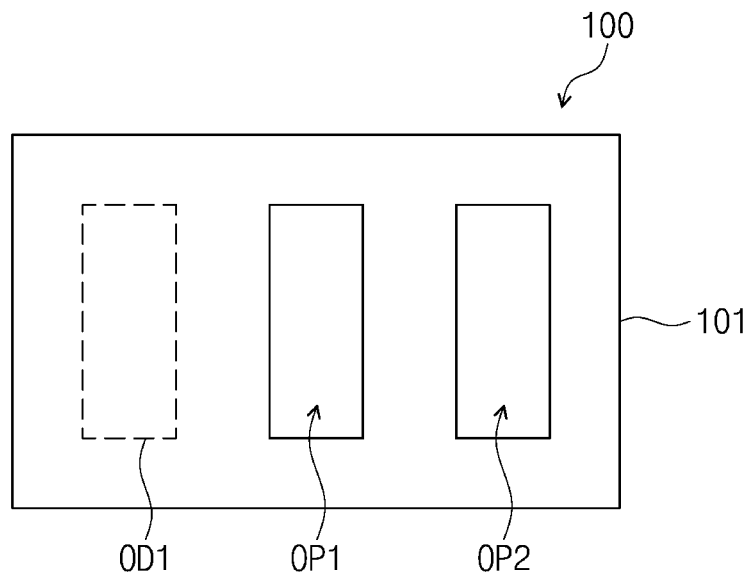
FIGS. 4A-4C are plan views illustrating first to third light-emitting device modules, respectively.

Referring to FIGS. 3 and 4A, the first light-emitting device module 100 may be located on the circuit device layer CL.

The first light-emitting device module 100 may include a first substrate 101, a first light-emitting device OD1, and a first non-emission layer 111.

The first substrate 101 may include silicon, glass, or plastic. A first penetration hole OP1 corresponding to the second pixel region PA2 and a second penetration hole OP2 corresponding to the third pixel region PA3 may be in the first substrate 101. The first penetration hole OP1 and the second penetration hole OP2 may be formed by using a laser beam, an etching process, a Bosch process (e.g., pulsed or time-multiplexed etching), or the like.

The first light-emitting device OD1 may be on the first substrate 101. The first light-emitting device OD1 may display a first color. The first light-emitting device OD1 may be located in the first pixel region PA1.

The first light-emitting device OD1 may include a first pixel electrode 103, a first light-emitting layer 105, a first opposite electrode 107, and a first protection layer 109.

The first pixel electrode 103 may be on the first substrate 101. Although not shown, at least one insulating layer may further be located between the first substrate 101 and the first pixel electrode 103.

The first pixel electrode 103 may be formed of or include at least one of silver (Ag), magnesium (Mg), aluminum (Al), platinum (Pt), palladium (Pd), gold (Au), nickel (Ni), neodymium (Nd), iridium (Ir), chromium (Cr), and compounds thereof.

In an embodiment, the first pixel electrode 103 may include a transparent conductive oxide (TCO) layer. The TCO layer may be formed of or include, for example, indium tin oxide (ITO), indium zinc oxide (IZO), zinc oxide (ZnO), indium oxide ($In_2O_3$), indium gallium oxide (IGO), or aluminum zinc oxide (AZO). In an embodiment, the first pixel electrode 103 may be a triple layered structure including ITO/Ag/ITO layers.

The first light-emitting layer 105 may include a first organic light-emitting layer. The first organic light-emitting layer may be located between the first pixel electrode 103 and the first opposite electrode 107 and may emit light whose color is one of red, green, blue, white, and other colors.

The first opposite electrode 107 may be formed of or include a conductive material having a low work function. For example, the first opposite electrode 107 may include at least one of silver (Ag), magnesium (Mg), aluminum (Al), platinum (Pt), palladium (Pd), gold (Au), nickel (Ni), neodymium (Nd), iridium (Ir), chromium (Cr), lithium (Li), calcium (Ca), and alloys thereof. In an embodiment, the first opposite electrode 107 may include at least one of aluminum (Al), silver (Ag), and magnesium-silver alloy (Mg:Ag). In an embodiment, the first opposite electrode 107 may include an alloy, in which a content of silver (Ag) is higher than that of magnesium (Mg).

The first protection layer 109 may be on the first opposite electrode 107. The first protection layer 109 may be used to protect the first opposite electrode 107. The first protection layer 109 may include an insulating material.

The first light-emitting layer 105 of the first light-emitting device OD1 may be located in the first pixel region PA1, but not in the margin region MA. The first opposite electrode 107 and the first protection layer 109 may be located in not only the first pixel region PA1 but also in the margin region(s) MA, but the present disclosure is not limited to this example.

The first non-emission layer 111 may be located on the same layer or at the same level as the first light-emitting layer 105. The first non-emission layer 111 may be located in the margin region MA. The first non-emission layer 111 and the first light-emitting layer 105 may constitute a single object (e.g., may be formed as a single integrated body). When viewed in a plan view, the first non-emission layer 111 may enclose (e.g., surround) the first light-emitting layer 105.

The first non-emission layer 111 may include a material different from that of the first light-emitting layer 105.

Atomic components of chemical materials constituting the first non-emission layer 111 and the first light-emitting layer 105 may be substantially the same but their molecular structures may be different from each other. In other words, a material constituting the first non-emission layer 111 and a material constituting the first light-emitting layer 105 may include substantially the same atoms but may differ from each other in the bonding structure of the atoms. There may be a difference in molecular structure between the material constituting the first non-emission layer 111 and the material constituting the first light-emitting layer 105. As described below, the molecular structure of the first non-emission layer 111 may be broken by short-wavelength light.

Light may not be emitted from the first non-emission layer 111. Even when external moisture or contamination material infiltrates into the first non-emission layer 111 connected to the first light-emitting layer 105, the infiltrated moisture or contamination material may not reach the first light-emitting layer 105, owing to a width of the first non-emission layer 111 (e.g., a width of the margin region MA). The first non-emission layer 111 may serve as a layer substantially encapsulating the first light-emitting device OD1. The first non-emission layer 111 may define the first pixel region PA1.

Figure 4B:
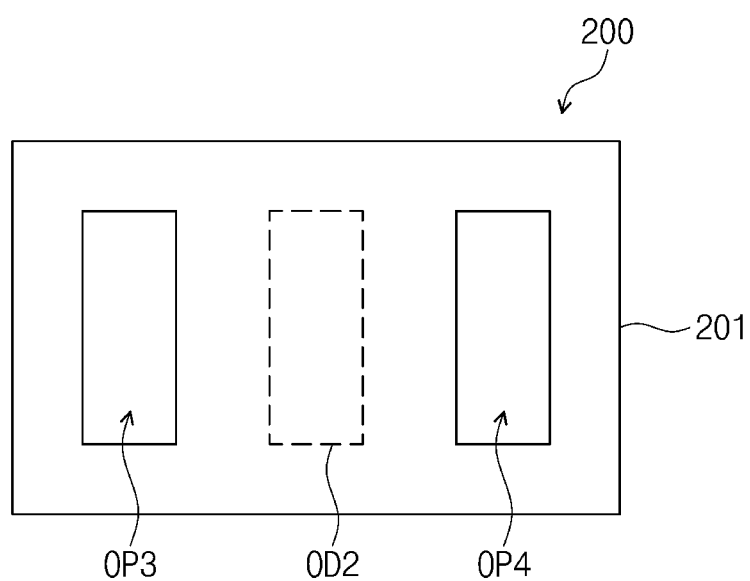

Referring to FIGS. 3 and 4B, the second light-emitting device module 200 may be located on the first light-emitting device module 100. Although not shown, the second light-emitting device module 200 may be adhered to the first light-emitting device module 100 by an adhesive material.

The second light-emitting device module 200 may include a second substrate 201, a second light-emitting device OD2, and a second non-emission layer 211.

The second substrate 201 may include silicon, glass, or plastic. A third penetration hole OP3 corresponding to the first pixel region PA1 and a fourth penetration hole OP4 corresponding to the third pixel region PA3 may be located in the second substrate 201. The third penetration hole OP3 and the fourth penetration hole OP4 may be formed by using a laser beam, an etching process, a Bosch process, or the like.

The second light-emitting device OD2 may be on the second substrate 201. The second light-emitting device OD2 may display a second color that is different from the first color. The second light-emitting device OD2 may be located in the second pixel region PA2.

The second light-emitting device OD2 may have substantially the same structure as the first light-emitting device OD1, except for the difference in material of the light-emitting layer, and some detailed description of the second light-emitting device OD2 may be omitted.

The second light-emitting device OD2 may include a second pixel electrode 203, a second light-emitting layer 205, a second opposite electrode 207, and a second protection layer 209. The second light-emitting layer 205 may include a material emitting light whose color is different from that of light emitted from the first light-emitting layer 105.

The second non-emission layer 211 may be located on the same layer or at the same level as the second light-emitting layer 205. The second non-emission layer 211 and the second light-emitting layer 205 may constitute a single object (e.g., may be formed as a single integrated body). The second non-emission layer 211 may include a material different from that of the second light-emitting layer 205. There may be a difference in molecular structure between the material constituting the second non-emission layer 211 and the material constituting the second light-emitting layer 205. The second non-emission layer 211 may define the second pixel region PA2.

Figure 4C:
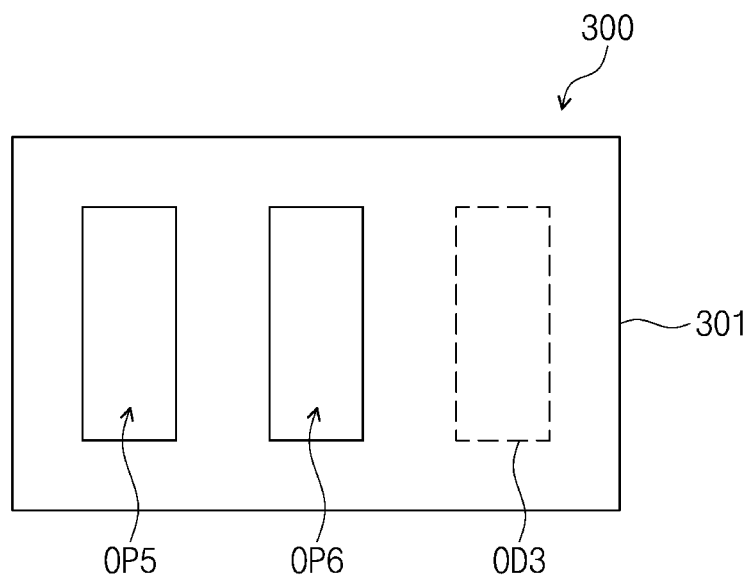

Referring to FIGS. 3 and 4C, the third light-emitting device module 300 may be located on the second light-emitting device module 200. Although not shown, the third light-emitting device module 300 may be adhered to the second light-emitting device module 200 by an adhesive material.

The third light-emitting device module 300 may include a third substrate 301, a third light-emitting device OD3, and a third non-emission layer 311.

The third substrate 301 may include silicon, glass, or plastic. A fifth penetration hole OP5 corresponding to the first pixel region PA1 and a sixth penetration hole OP6 corresponding to the second pixel region PA2 may be provided in the third substrate 301. The fifth penetration hole OP5 and the sixth penetration hole OP6 may be formed by using a laser beam, an etching process, a Bosch process, or the like.

The third light-emitting device OD3 may be located on the third substrate 301. The third light-emitting device OD3 may display a third color that is different from the first color and the second color. The third light-emitting device OD3 may be located in the third pixel region PA3.

The third light-emitting device OD3 may have substantially the same structure as the first light-emitting device OD1, except for the difference in material of the light-emitting layer, and some detailed description of the third light-emitting device OD3 may be omitted.

The third light-emitting device OD3 may include a third pixel electrode 303, a third light-emitting layer 305, a third opposite electrode 307, and a third protection layer 309. The third light-emitting layer 305 may include a material emitting light whose color is different from that of light emitted from the first light-emitting layer 105 and the second light-emitting layer 205.

The third non-emission layer 311 may be located on the same layer or at the same level as the third light-emitting layer 305. The third non-emission layer 311 and the third light-emitting layer 305 may constitute a single object (e.g., may be formed as a single integrated body). The third non-emission layer 311 may include a material different from the third light-emitting layer 305. A molecular structure of a material constituting the third non-emission layer 311 may be different from a molecular structure of a material constituting the third light-emitting layer 305. The third non-emission layer 311 may define the third pixel region PA3.

In a display apparatus according to a comparative example, an area of a pixel region may be determined by a pixel definition layer, which is in the form of an organic material between adjacent pixel regions.

In the display apparatus 1000 according to an embodiment of the present disclosure, because the first to third non-emission layers 111, 211, and 311 serve as the pixel definition layer in the display apparatus of the comparative example, it may be possible to omit an additional process of forming the pixel definition layer and to simplify the overall manufacturing process.

Furthermore, in the display apparatus of the comparative example, in the case where the first to third light-emitting devices are on the same layer, due to process limitation in a deposition/patterning process, the margin region may be formed to have a sufficiently large width, and this may make it challenging or difficult to manufacture a high-resolution display apparatus.

In an embodiment, because the first to third light-emitting device modules 100, 200, and 300 are located on different layers or at different levels, it may be possible to reduce a planar width of the margin region(s) MA between the first to third light-emitting devices OD1, OD2, and OD3 to a value that is much smaller than that of the comparative example display apparatus. In principle, the margin region MA may have the width of 1 μm or less. Thus, the display apparatus 1000 according to an embodiment of the present disclosure may have a resolution higher than that of the display apparatus according to the comparative example.

Figure 5:
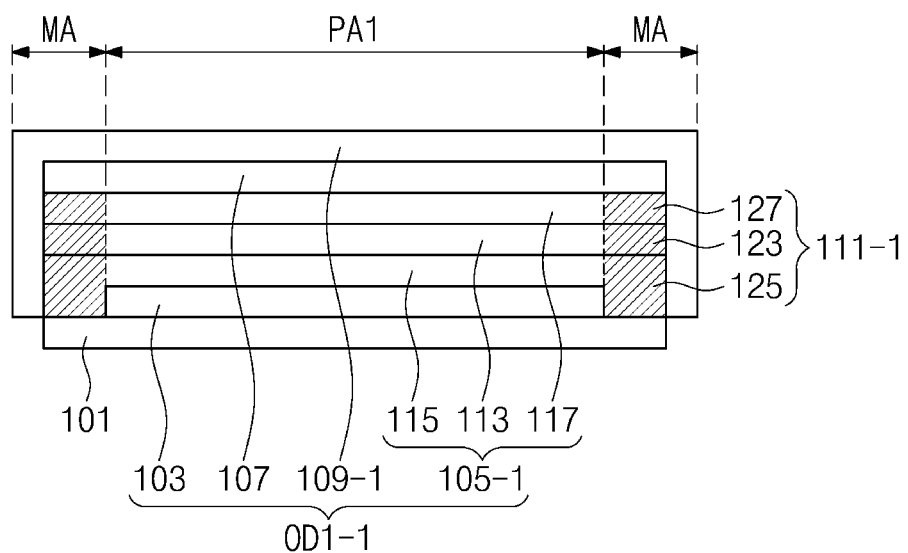
FIG. 5 is an enlarged sectional view illustrating a first light-emitting device, which is on the first substrate of FIG. 3, according to another embodiment of the present disclosure.

FIG. 5 is an enlarged sectional view illustrating a first light-emitting device, which is located on the first substrate of FIG. 3, according to another embodiment of the present disclosure.

Referring to FIG. 5, a first light-emitting layer 105-1 of a first light-emitting device OD1-1 may include a first organic light-emitting layer 113, a first hole control layer 115, and a first electron control layer 117.

The first hole control layer 115 may be located between the first pixel electrode 103 and the first organic light-emitting layer 113. The first electron control layer 117 may be located between the first opposite electrode 107 and the first organic light-emitting layer 113.

The first hole control layer 115 may be used to transfer holes from the first pixel electrode 103 to the first organic light-emitting layer 113, and the first electron control layer 117 may be used to transfer electrons from the first opposite electrode 107 to the first organic light-emitting layer 113.

A first non-emission layer 111-1 may include a first organic non-emission layer 123, a first hole non-control layer 125, and a first electron non-control layer 127.

The first organic non-emission layer 123 may be located on the same layer or at the same level as the first organic light-emitting layer 113. The first organic non-emission layer 123 and the first organic light-emitting layer 113 may constitute a single object (e.g., may be formed as a single integrated body).

The first organic non-emission layer 123 may include a material different from that of the first organic light-emitting layer 113. The material constituting the first organic non-emission layer 123 and the material constituting the first organic light-emitting layer 113 may have molecular structures that are different from each other.

The first hole non-control layer 125 may be located on the same layer or at the same level as the first hole control layer 115. The first hole non-control layer 125 and the first hole control layer 115 may constitute a single object (e.g., may be formed as a single integrated body).

The first hole non-control layer 125 may include a material different from that of the first hole control layer 115. The material constituting the first hole non-control layer 125 and the material constituting the first hole control layer 115 may have molecular structures that are different from each other.

The first electron non-control layer 127 may be located on the same layer or at the same level as the first electron control layer 117. The first electron non-control layer 127 and the first electron control layer 117 may constitute a single object (e.g., may be formed as a single integrated body).

The first electron non-control layer 127 may include a material different from the first electron control layer 117. The material constituting the first electron non-control layer 127 and the material constituting the first electron control layer 117 may have molecular structures that are different from each other.

A first protection layer 109-1 of the first light-emitting device OD1-1 may cover not only top and side surfaces of the first opposite electrode 107 but also a side surface of the first non-emission layer 111-1. Owing to the first protection layer 109-1, it may be possible to prevent an external moisture or contamination material from entering the first non-emission layer 111-1 and thereby to more stably protect the first light-emitting device OD1-1.

Although the first light-emitting device OD1-1 is exemplarily illustrated in FIG. 5, the second and third light-emitting devices OD2 and OD3 of FIG. 3 may also have a structure similar to that of the first light-emitting device OD1-1 of FIG. 5.

Figure 6:
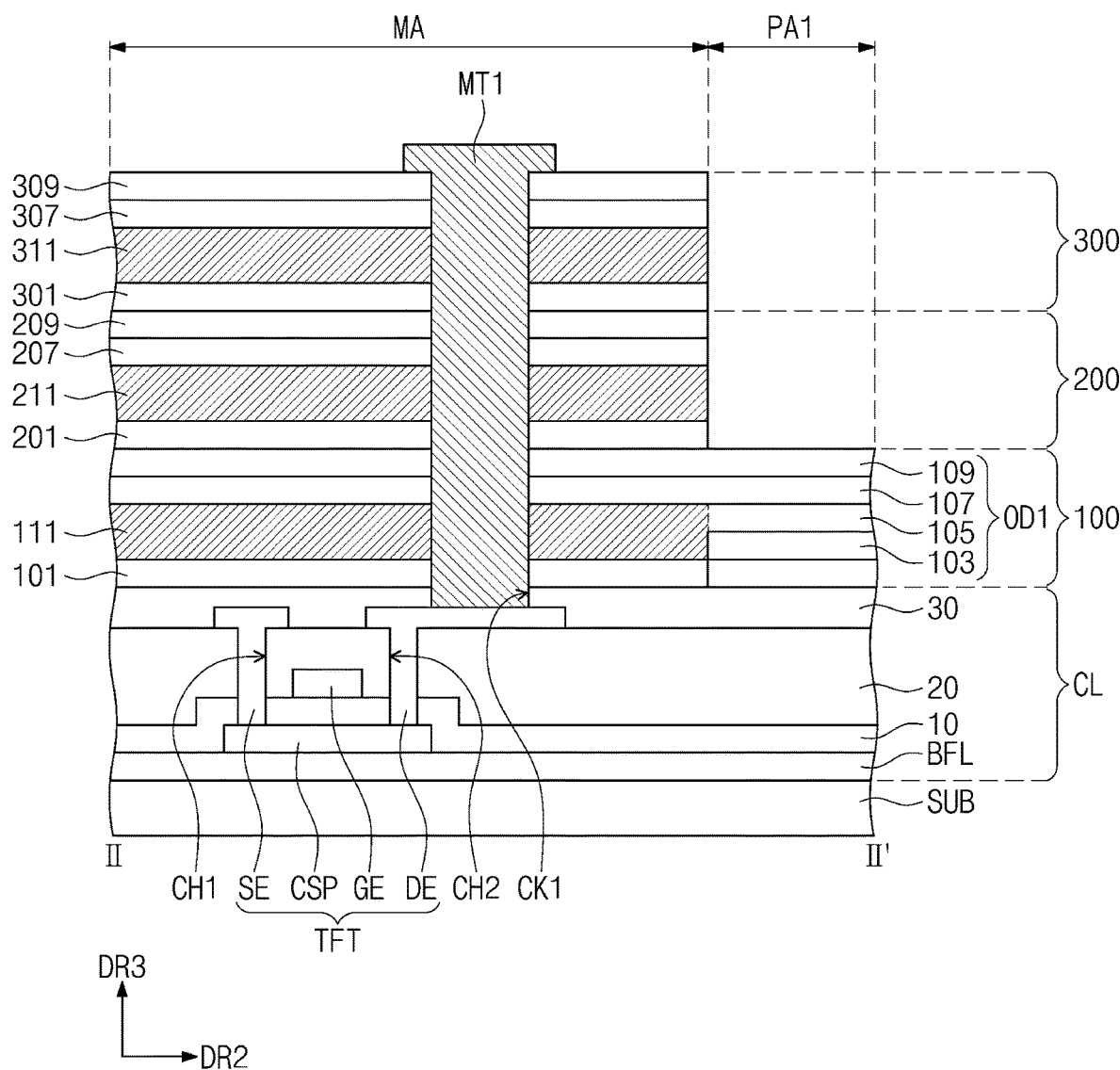
FIG. 6 is a sectional view taken along the line II-II' of FIG. 1.

FIG. 6 is a sectional view taken along the line II-II' of FIG. 1.

A connection structure between the first pixel electrode 103 of the first light-emitting device module 100 and the circuit device layer CL will be described with reference to FIG. 6.

FIG. 6 illustrates an example of the circuit device layer CL including a transistor TFT. The transistor TFT may be the first thin film transistor T1 or the second thin film transistor T2 described with reference to FIG. 2. The circuit device layer CL may include a buffer layer BFL and first to third insulating layers 10, 20, and 30.

The buffer layer BFL may improve a bonding strength between the base layer SUB and conductive or semiconductor patterns. Although not shown, a barrier layer for preventing inflow of a contamination material may be on the top surface of the base layer SUB. The buffer layer BFL and the barrier layer may be optionally used or omitted.

A semiconductor pattern CSP of the transistor TFT may be located on the buffer layer BFL. A material for the semiconductor pattern CSP may be selected from amorphous silicon, polysilicon, or metal oxide semiconductor materials.

The first insulating layer 10 may be located on the semiconductor pattern CSP. A control electrode GE of the transistor TFT may be located on the first insulating layer 10. The control electrode GE may be formed by the same photolithography process as that for the scan line SL described with reference to FIG. 2.

The second insulating layer 20 may be located on the first insulating layer 10 to cover the control electrode GE. An input electrode SE and an output electrode DE of the transistor TFT may be located on the second insulating layer 20.

The input electrode SE and the output electrode DE may be connected to two different portions of the semiconductor pattern CSP through a first contact hole CH1 and a second contact hole CH2, which penetrate the first insulating layer 10 and the second insulating layer 20. In an embodiment, the transistor TFT may be modified to have a bottom gate structure, in which the control electrode GE is located below the semiconductor pattern CSP.

The third insulating layer 30 may be on the second insulating layer 20 to cover the input electrode SE and the output electrode DE. The third insulating layer 30 may provide a flat top surface.

A portion of the first pixel electrode 103 of the first light-emitting device OD1 may be overlapped with the margin region MA.

A first pixel contact hole CK1 may be located in the margin region MA. In the margin region MA, the first pixel contact hole CK1 may penetrate the first to third light-emitting device modules 100, 200, and 300, and the third insulating layer 30, and may expose the output electrode DE of the transistor TFT.

A portion of the first pixel electrode 103 extended to the margin region MA may be exposed by the first pixel contact hole CK1.

The first opposite electrode 107 may not be overlapped with the first pixel contact hole CK1 and may not be exposed by the first pixel contact hole CK1.

A first conductive layer MT1 may be located in the first pixel contact hole CK1. The first pixel electrode 103 may be electrically connected to the output electrode DE of the transistor TFT through the first conductive layer MT1.

The first conductive layer MT1 may be formed by forming a seed layer on the exposed surface of the output electrode DE and performing a plating process to fill the first pixel contact hole CK1 with a conductive metal.

The second pixel electrode 203 may be connected to the transistor of the circuit device layer CL through a second pixel contact hole CK2 (see, for example, FIG. 1), and the third pixel electrode 303 may be connected to the transistor of the circuit device layer CL through a third pixel contact hole CK3 (see, for example, FIG. 1), similar to the connection structure between the first pixel electrode 103 and the circuit device layer CL.

Figure 7:
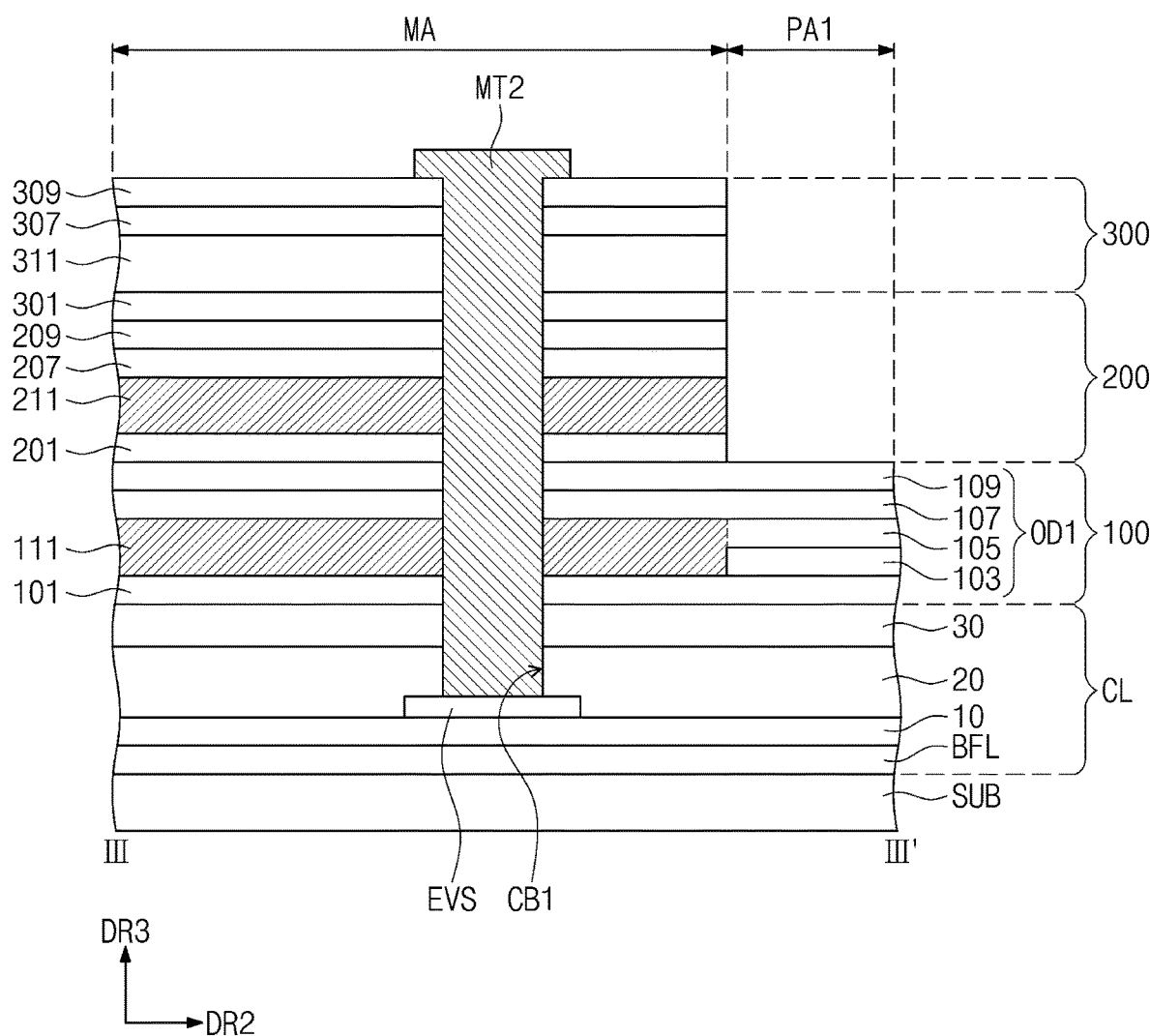
FIG. 7 is a sectional view taken along the line III-III' of FIG. 1.

FIG. 7 is a sectional view taken along the line of FIG. 1.

A connection structure between the first opposite electrode 107 of the first light-emitting device module 100 and the circuit device layer CL will be described with reference to FIG. 7.

The circuit device layer CL may include a power voltage pattern EVS. The power voltage pattern EVS may receive a constant reference voltage. FIG. 7 illustrates an example, in which the power voltage pattern EVS is located between the first insulating layer 10 and the second insulating layer 20, but the present disclosure is not limited to this example. For example, the position of the power voltage pattern EVS may be variously changed.

A portion of the first opposite electrode 107 of the first light-emitting device OD1 may be overlapped with the margin region MA.

A first opposite contact hole CB1 may be provided in the margin region MA. In the margin region MA, the first opposite contact hole CB1 may penetrate the first to third light-emitting device modules 100, 200, and 300, the second insulating layer 20 and the third insulating layer 30, and may expose the power voltage pattern EVS.

A portion of the first opposite electrode 107 extended to the margin region MA may be exposed by the first opposite contact hole CB1.

The first pixel electrode 103 may not be overlapped with the first opposite contact hole CB1 and may not be exposed by the first opposite contact hole CB1.

A second conductive layer MT2 may be located in the first opposite contact hole CB1. The first opposite electrode 107 may be electrically connected to the power voltage pattern EVS through the second conductive layer MT2.

In addition, the second opposite electrode 207 and the third opposite electrode 307 may be overlapped with the margin region MA, and the second opposite electrode 207 and the third opposite electrode 307 may be partially exposed by the first opposite contact hole CB1. The second opposite electrode 207 and the third opposite electrode 307 may be electrically connected to the power voltage pattern EVS through the second conductive layer MT2.

The second conductive layer MT2 may be formed by forming a seed layer on the exposed surface of the power voltage pattern EVS and performing a plating process to fill the first opposite contact hole CB1 with a conductive metal.

In an embodiment, the power voltage pattern EVS may be electrically connected to the first to third opposite electrodes 107, 207, and 307 through the first to third opposite contact holes CB1, CB2, and CB3, respectively. However, the present disclosure is not limited to this example, and in an embodiment, because the first to third opposite electrodes 107, 207, and 307 may receive the same voltage, one or more of the first to third opposite contact holes CB1, CB2, and CB3 may be omitted.

Figure 8:
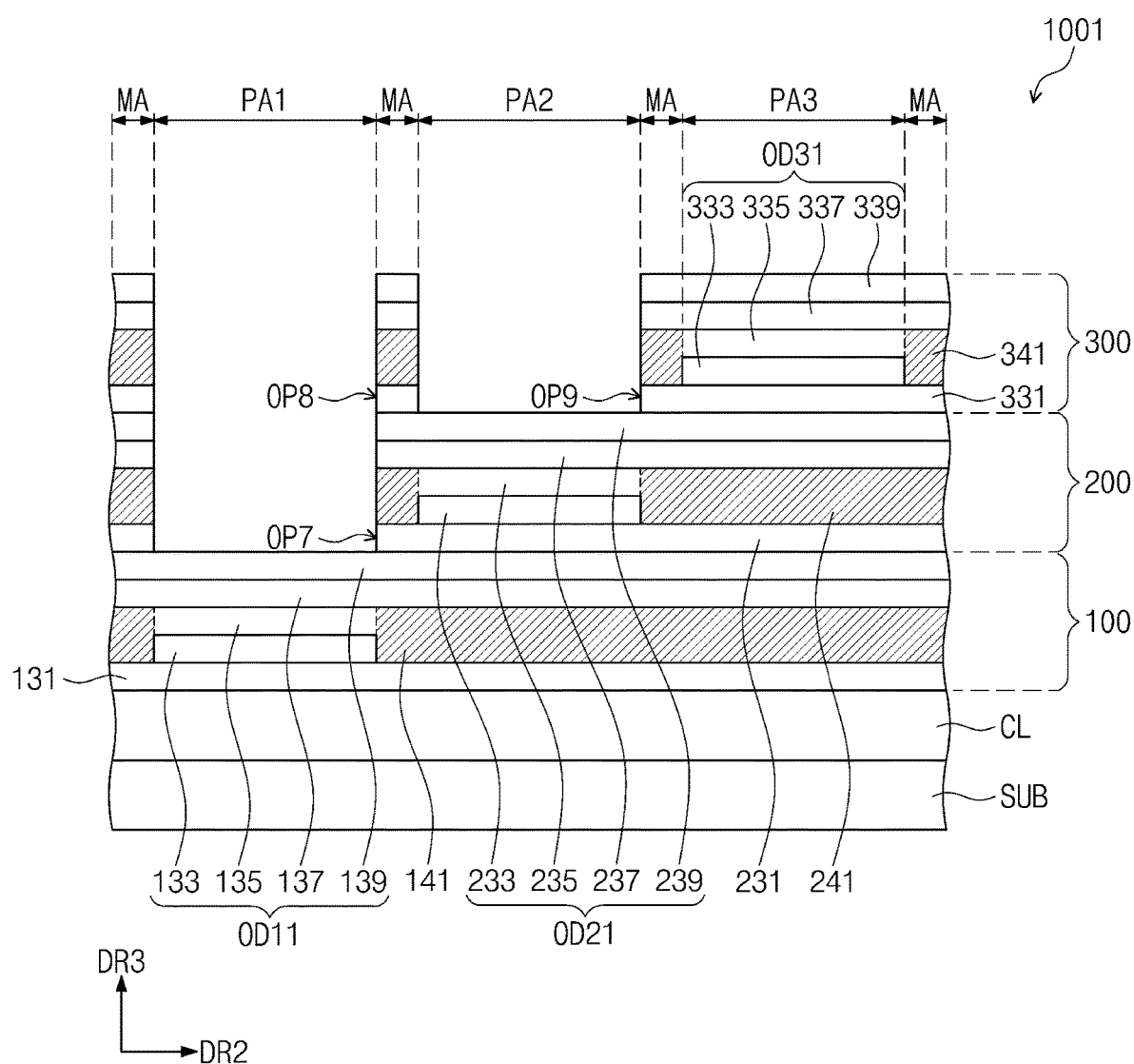
FIG. 8 is a sectional view, which is taken along the line I-I' of FIG. 3, illustrates a display apparatus according to another embodiment of the present disclosure.

FIG. 8 is a sectional view, which is taken along the line I-I' of FIG. 1 and illustrates a display apparatus according to another embodiment of the present disclosure.

In the following description of a display apparatus 1001 of FIG. 8, different features from the display apparatus 1000 according to the embodiments of FIG. 3 will be discussed.

A first light-emitting device module 100, a second light-emitting device module 200, and a third light-emitting device module 300 may be sequentially arranged on the circuit device layer CL.

The first light-emitting device module 100 may include a first substrate 131, a first light-emitting device OD11, and a first non-emission layer 141. The first light-emitting device OD11 may include a first pixel electrode 133, a first light-emitting layer 135, a first opposite electrode 137, and a first protection layer 139.

A penetration hole may not be located in the first substrate 131 of the first light-emitting device module 100. Thus, the first substrate 131 may be overlapped with the first pixel region PA1, the second pixel region PA2, and the third pixel region PA3.

The first light-emitting device OD11 may be located in the first pixel region PA1. The first opposite electrode 137 and the first protection layer 139 of the first light-emitting device module 100 may be overlapped with the second pixel region PA2 and the third pixel region PA3.

The first non-emission layer 141 may be overlapped with not only the margin region MA but also the second and third pixel regions PA2 and PA3.

The second light-emitting device module 200 may include a second substrate 231, a second light-emitting device OD21, and a second non-emission layer 241. The second light-emitting device OD21 may include a second pixel electrode 233, a second light-emitting layer 235, a second opposite electrode 237, and a second protection layer 239.

A seventh penetration hole OP7 corresponding to the first pixel region PA1 may be provided in the second substrate 231. The second substrate 231 may be overlapped with the second pixel region PA2 and the third pixel region PA3.

The second light-emitting device OD21 may be located in the second pixel region PA2. The second opposite electrode 237 and the second protection layer 239 of the second light-emitting device module 200 may be overlapped with the third pixel region PA3 but may not be overlapped with the first pixel region PA1.

The second non-emission layer 241 may be overlapped with not only the margin region MA but also the third pixel region PA3.

The third light-emitting device module 300 may include a third substrate 331, a third light-emitting device OD31, and a third non-emission layer 341. The third light-emitting device OD31 may include a third pixel electrode 333, a third light-emitting layer 335, a third opposite electrode 337, and a third protection layer 339.

An eighth penetration hole OP8 corresponding to the first pixel region PA1 and a ninth penetration hole OP9 corresponding to the second pixel region PA2 may be located in the third substrate 331. The third substrate 331 may be overlapped with the third pixel region PA3.

The third light-emitting device OD31 may be located in the third pixel region PA3. The third opposite electrode 337 and the third protection layer 339 of the third light-emitting device module 300 may not be overlapped with the first pixel region PA1 and the second pixel region PA2.

The third non-emission layer 341 may not be overlapped with the first pixel region PA1 and the second pixel region PA2.

In a process of manufacturing the display apparatus 1001 described with reference to FIG. 8, it may be possible to omit a process of forming a penetration hole in the first substrate 131 of the first light-emitting device module 100, compared with the display apparatus 1000 described with reference to FIG. 3. Thus, the manufacturing process may be simplified, compared with the display apparatus 1000 of FIG. 3.

Figure 9:
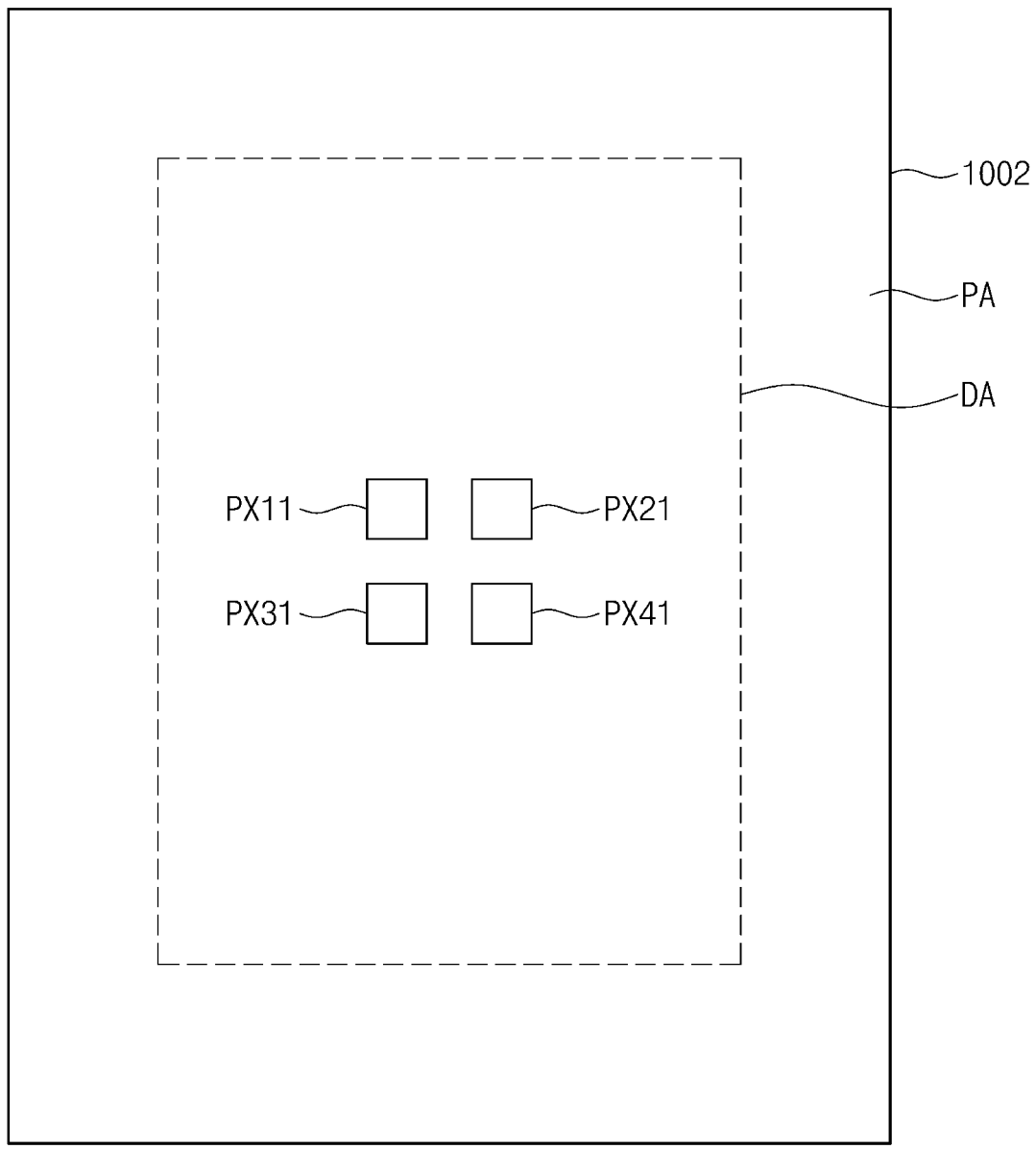
FIG. 9 is a plan view schematically illustrating a display apparatus according to another embodiment of the present disclosure.

FIG. 9 is a plan view schematically illustrating a display apparatus according to another embodiment of the present disclosure.

First to fourth pixels PX11, PX21, PX31, and PX41 emitting lights of different colors may be located in a display region DA of a display apparatus 1002. For example, the first to fourth pixels PX11, PX21, PX31, and PX41 may emit red, green, blue, and white lights, respectively.

When compared with the display apparatus 1000 described with reference to FIGS. 1-3, the display apparatus 1000 of FIG. 3 may include three light-emitting device modules 100, 200, and 300, which are sequentially stacked, and the display apparatus 1002 of FIG. 9 may include four light-emitting device modules, which are sequentially stacked. The structure of the light-emitting device module may be substantially similar to each of the light-emitting device modules 100, 200, and 300 described with reference to FIG. 3, and a detailed description may be omitted.

Figure 10:
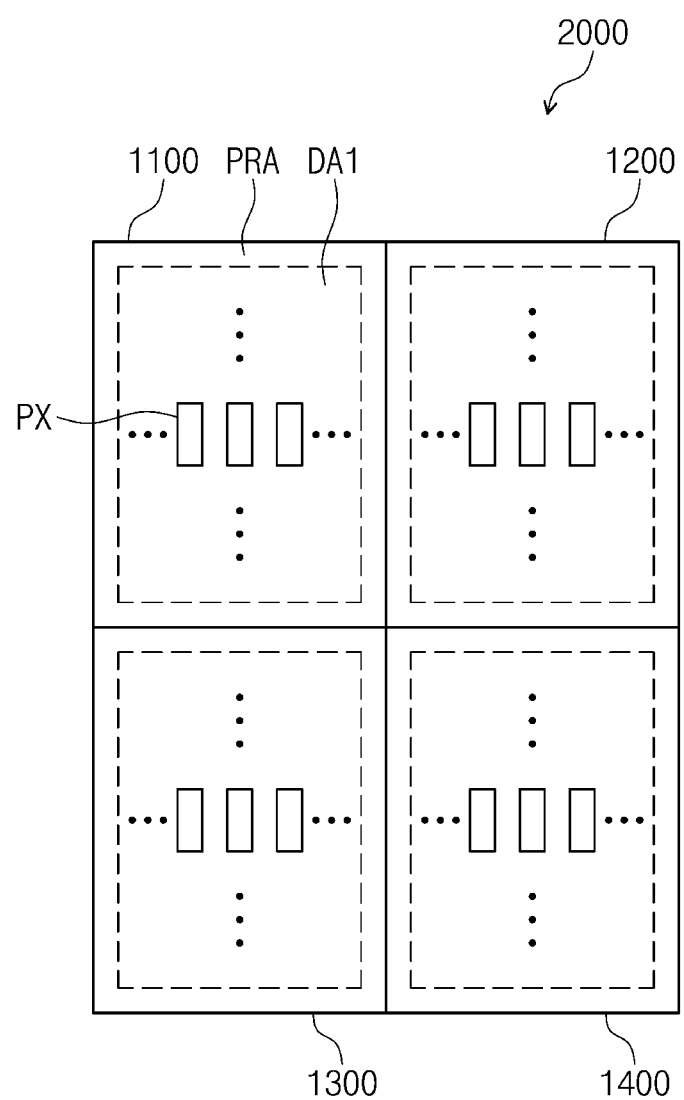
FIG. 10 is a plan view illustrating an image information device according to an embodiment of the present disclosure.

FIG. 10 is a plan view illustrating an image information device according to an embodiment of the present disclosure.

An image information device 2000 may include a plurality of display apparatuses 1100, 1200, 1300, and 1400. The plurality of display apparatuses 1100, 1200, 1300, and 1400 may be electrically connected to each other to output a single continuous image.

Each of the display apparatuses 1100, 1200, 1300, and 1400 may include a display region DA1, which is used to display an image, and a peripheral region PRA, which is located outside the display region DA1.

A structure of each of the display apparatuses 1100, 1200, 1300, and 1400 may be substantially similar to the display apparatus 1000 described with reference to FIGS. 1-7, and a detailed description may be omitted.

In at least a portion of the display apparatuses 1100, 1200, 1300, and 1400 of FIG. 10, a driver, a power voltage supplying line, a pad, or the like may not be located in the peripheral region PRA, unlike the display apparatus 1000 of FIG. 1. If the driver, the power voltage supplying line, and the pad are not located in the peripheral region PRA of the display apparatus 1100, a width of the peripheral region PRA may be substantially the same as a width of the margin region MA between pixels PX.

A printed circuit board or a cable for receiving signals from the outside may be connected to at least one of the display apparatuses 1100, 1200, 1300, and 1400. In addition, a driver or the like may be located in the peripheral region PRA of at least one of the display apparatuses 1100, 1200, 1300, and 1400.

In the display apparatuses 1100, 1200, 1300, and 1400 according to some embodiments of the present disclosure, the margin region(s) MA may have a relatively small width, compared with the comparative example, and thus, it may be possible to realize a high-resolution display apparatus. Furthermore, because a plurality of display apparatuses is electrically connected to each other, it may be possible to realize a high-resolution image information device 2000.

FIGS. 11A-11H are sectional views, which are taken along the line of FIG. 1 and illustrate a process of manufacturing the first light-emitting device module of the display apparatus shown in FIG. 1.

Figure 11A:
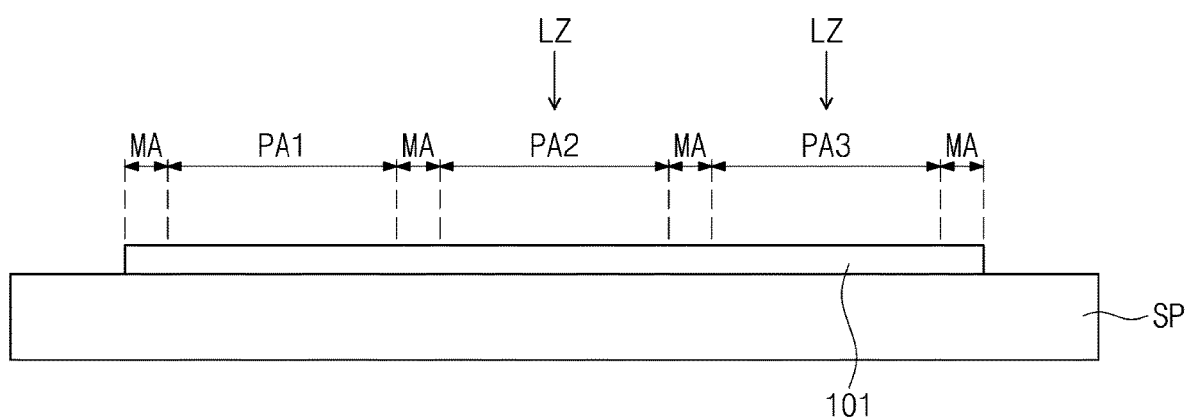
FIGS. 11A-11H are sectional views, which are taken along the line of FIG. 1 and illustrate a process of manufacturing the first light-emitting device module of the display apparatus shown in FIG. 1.

Referring to FIG. 11A, a support substrate SP may be prepared. A substrate 101 may be located on the support substrate SP.

The substrate 101 may include silicon, glass, or plastic.

Figure 11B:
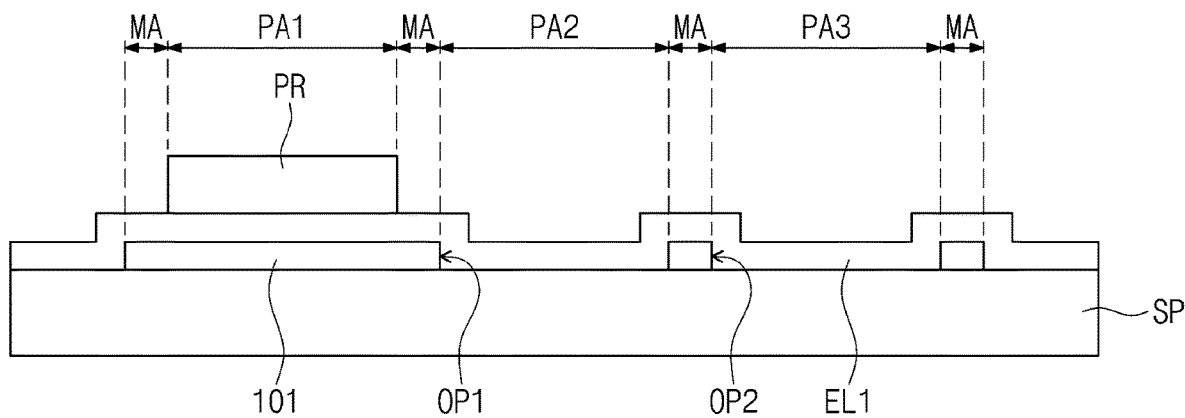

Referring to FIGS. 11A and 11B, the first penetration hole OP1 and the second penetration hole OP2, which correspond to the second pixel region PA2 and the third pixel region PA3, respectively, may be located in the substrate 101. Thus, the first substrate 101 may be formed.

In the present embodiment, a process of irradiating the first substrate 101 with a laser LZ is illustrated as an example of a method for forming the first penetration hole OP1 and the second penetration hole OP2. However, the present disclosure is not limited to this example, and the first penetration hole OP1 and the second penetration hole OP2 may be formed in the first substrate 101 using a dry etching process or a Bosch deep etching process.

Next, as shown in FIG. 11B, a first conductive layer EU may be formed on the first substrate 101.

The first conductive layer EL1 may include iridium (Ir), chromium (Cr), or compounds thereof.

In an embodiment, the first conductive layer EL1 may include a transparent conductive oxide (TCO) layer. The TCO layer may be formed of, for example, indium tin oxide (ITO), indium zinc oxide (IZO), zinc oxide (ZnO), indium oxide (In2O3), indium gallium oxide (IGO), or aluminum zinc oxide (AZO).

The first conductive layer EL1 may include a plurality of layers. In an embodiment, the first conductive layer EL1 may be a triple layered structure including ITO/Ag/ITO layers.

Thereafter, a photosensitive film PR may be located on the first conductive layer EL1. The photosensitive film PR may be located on a region of the first conductive layer EU covering the first pixel region PA1.

Figure 11C:
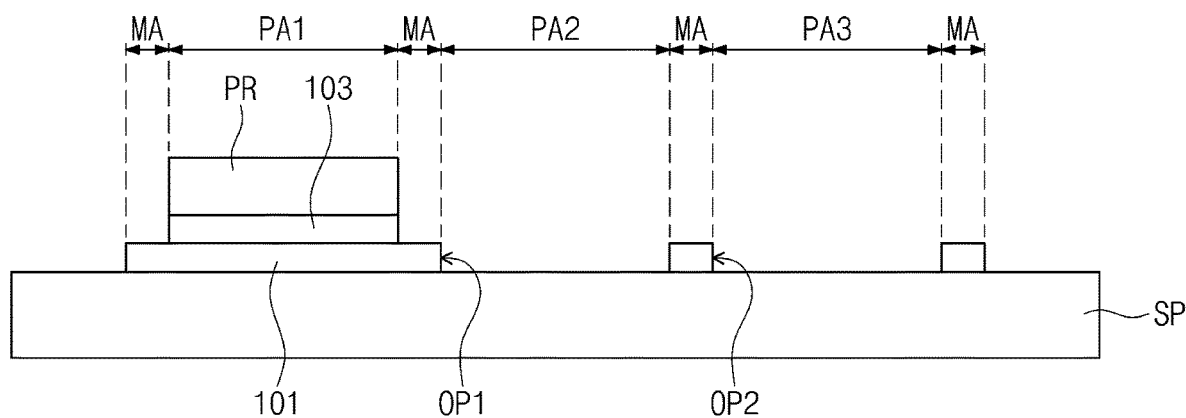

Next, as shown in FIG. 11C, the first conductive layer EU may be patterned by a wet or dry etching process using the photosensitive film PR as an etch mask. Accordingly, the first pixel electrode 103 may be formed to be overlapped with the photosensitive film PR.

Figure 11D:
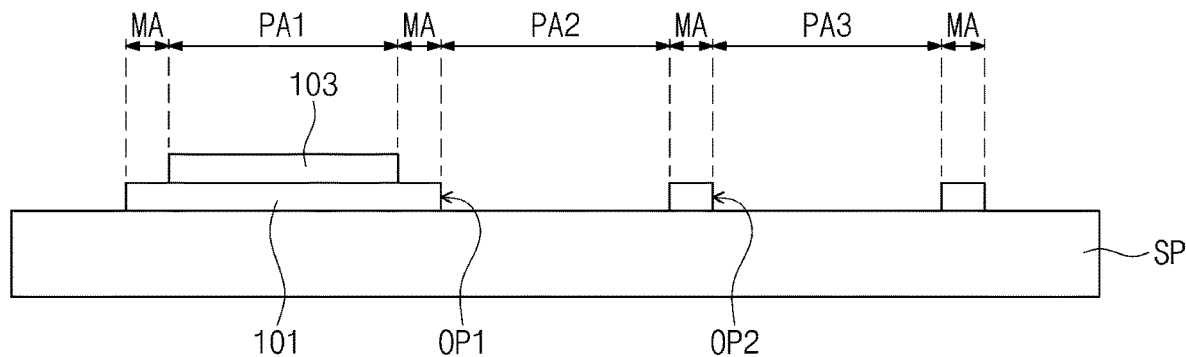

Referring to FIG. 11D, the photosensitive film PR may be removed.

Figure 11E:
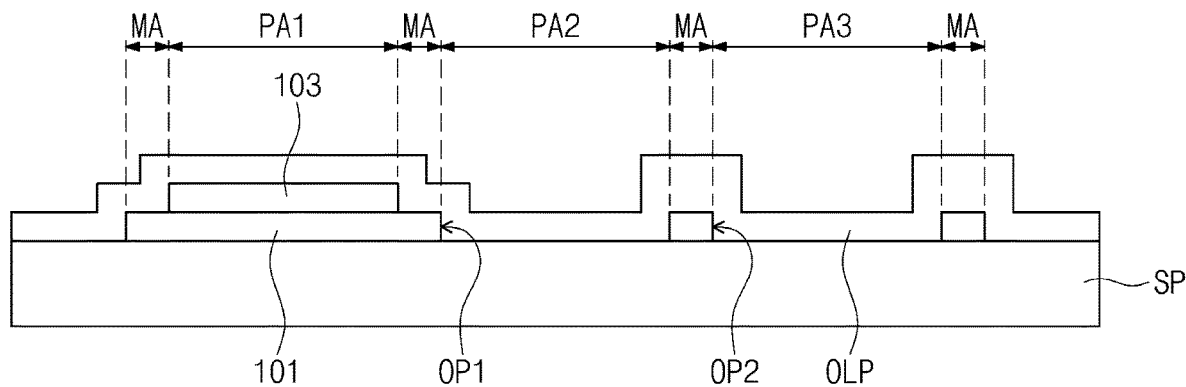

Referring to FIG. 11E, a light-emitting pattern OLP may be formed on the first pixel electrode 103.

The light-emitting pattern OLP may be formed by sequentially depositing a hole control layer, an organic light-emitting layer, and an electron control layer.

Figure 11F:
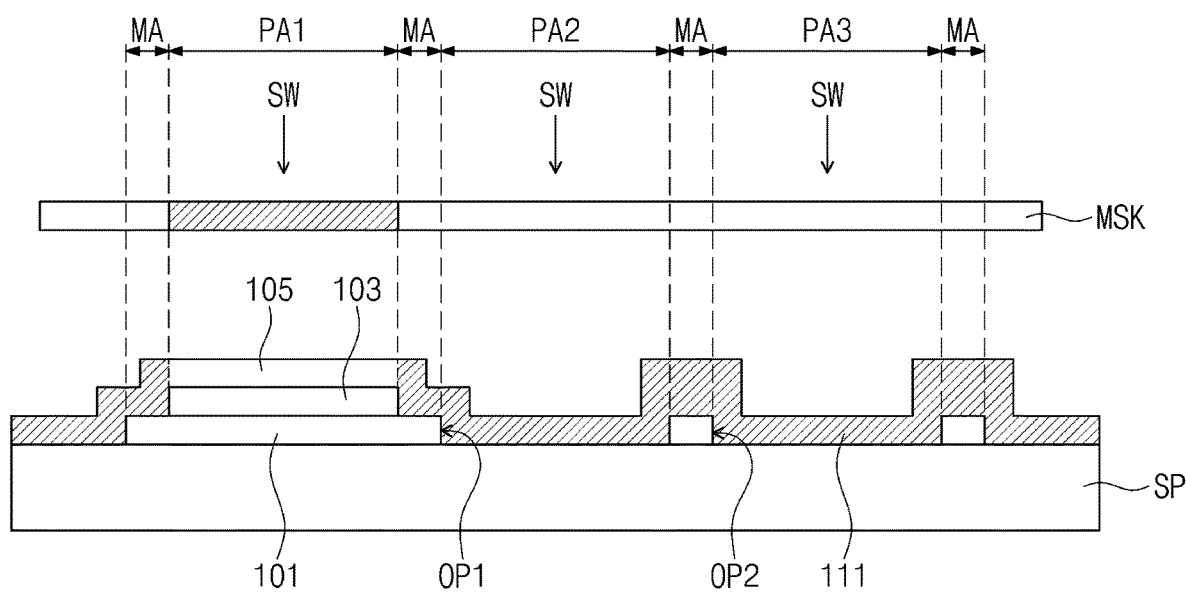

Thereafter, as shown in FIG. 11F, a mask MSK may be placed over the light-emitting pattern OLP. The mask MSK may block light incident toward the first pixel region PA1 and may transmit light incident toward a region other than the first pixel region PA1.

A first light SW may be irradiated onto the light-emitting pattern OLP through the mask MSK. The first light SW may be short-wavelength light or may have a wavelength of 300 nm or shorter.

A portion of the light-emitting pattern OLP, which is overlapped with a region other than the first pixel region PA1, may be defined as the first non-emission layer 111, and the first light SW may result in damage to the first non-emission layer 111. By way of example, the first light SW may cause breakage of a molecular structure (e.g., breakage in bonding structure of carbon molecules) constituting the portion of the light-emitting pattern OLP, which is overlapped with the region other than the first pixel region PA1. The portion of the light-emitting pattern OLP damaged by the first light SW may not emit light, even when electrons and holes are injected thereto.

The first non-emission layer 111 may play the same role as the pixel definition layer in the display apparatus according to the comparative example. In an embodiment, because the first non-emission layer 111 is formed by the irradiation of the first light SW, it may not be necessary to form the pixel definition layer separately and this may make it possible to simplify a manufacturing process.

A portion of the light-emitting pattern OLP, to which the first light SW is not irradiated, may be defined as the first light-emitting layer 105, and may emit light when voltages are applied to the first pixel electrode 103 and the first opposite electrode 107.

Because the mask MSK is used to determine a region to be irradiated with the first light SW, it may be possible to control a size and a position of a light-emitting region (e.g., the first pixel region PA1) capable of effectively emitting light.

Figure 11G:
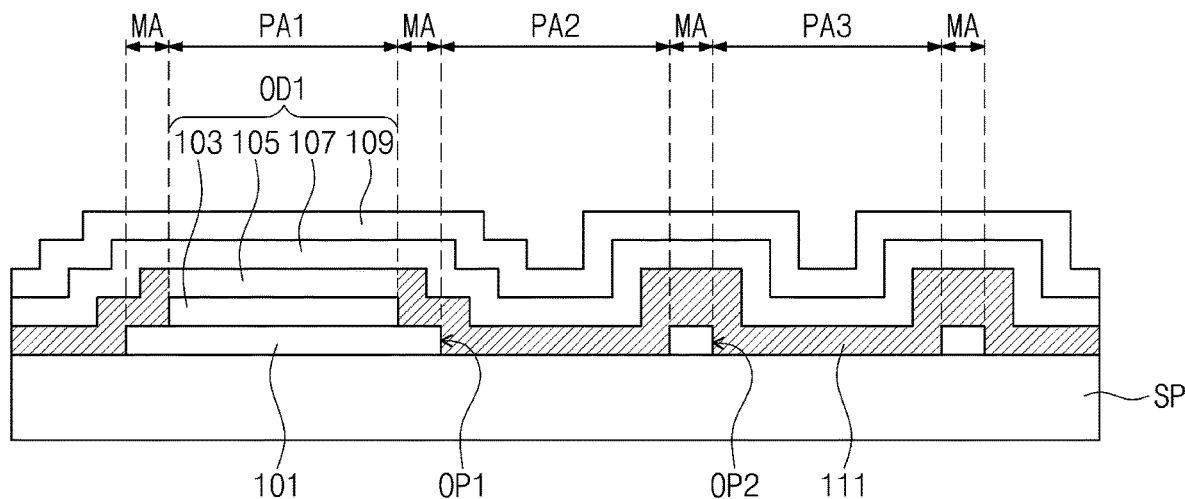

Thereafter, as shown in FIG. 11G, the first opposite electrode 107 may be formed on the first light-emitting layer 105 and the first non-emission layer 111.

The first opposite electrode 107 may include a conductive material having a low work function. For example, the first opposite electrode 107 may include at least one of silver (Ag), magnesium (Mg), aluminum (Al), platinum (Pt), palladium (Pd), gold (Au), nickel (Ni), neodymium (Nd), iridium (Ir), chromium (Cr), lithium (Li), calcium (Ca), or alloys thereof. In an embodiment, the first opposite electrode 107 may include at least one of aluminum (Al), silver (Ag), and magnesium-silver alloy (Mg:Ag). In an embodiment, the first opposite electrode 107 may include an alloy, in which a content of silver (Ag) is higher than that of magnesium (Mg).

The first opposite electrode 107 may be patterned in a manner similar to a process of forming the first pixel electrode 103 described with reference to FIGS. 11B-11D. Thus, a detailed description of this process may be omitted.

Next, the first protection layer 109 may be formed on the first opposite electrode 107. The first protection layer 109 may include an insulating material. As a result, the process of manufacturing the first light-emitting device OD1 may be finished.

Figure 11H:
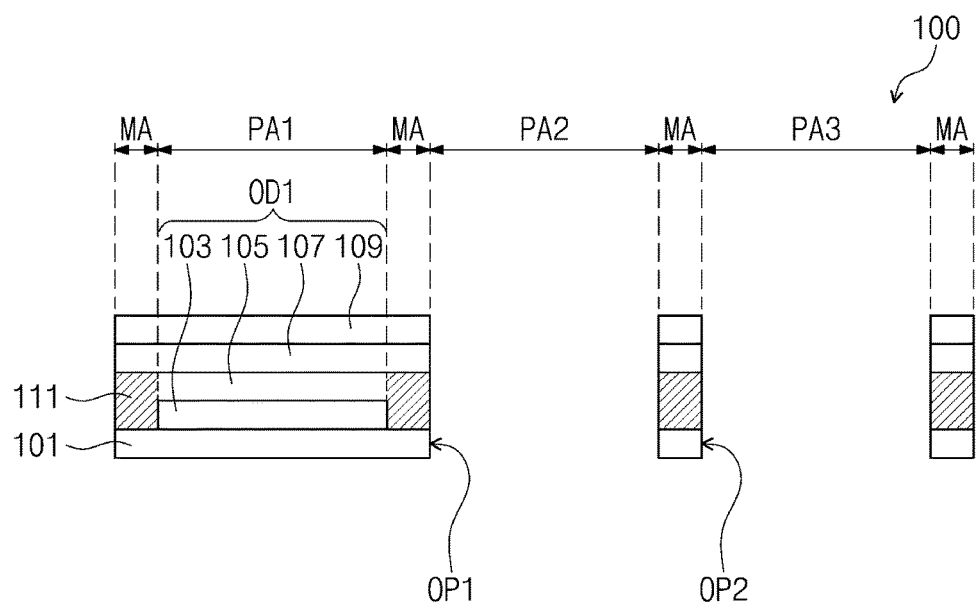

Thereafter, referring to FIG. 11H, the first substrate 101 may be separated from the support substrate SP. As a result, the fabrication of the first light-emitting device module 100 may be finished.

The support substrate SP separated from the first substrate 101 may be discarded or may be cleaned and reused.

In a display apparatus according to an embodiment of the present disclosure, a plurality of light-emitting device modules may be located at different levels, and this may make it possible to reduce a distance between light-emitting devices and to realize a high-resolution display apparatus.

In a method of manufacturing a display apparatus according to an embodiment of the present disclosure, a short-wavelength light may be irradiated onto a light-emitting pattern, which is located on a remaining region other than a light-emitting region, and thus, it may be unnecessary to form a pixel definition layer separately. This may make it possible to simplify a manufacturing process.

While example embodiments of the present disclosure have been particularly shown and described, it will be understood by one of ordinary skill in the art that variations in form and detail may be made therein without departing from the spirit and scope of the present disclosure as set forth in the attached claims and their equivalents.

What is claimed is:

1. A display apparatus comprising:
a substrate comprising a first pixel region and a second pixel region adjacent to the first pixel region;
a circuit device layer on the substrate;
a first light-emitting device module on the circuit device layer, the first light-emitting device module comprising a first non-emission layer and a first light-emitting device comprising a first light-emitting layer, the first light-emitting device overlapping the first pixel region to display a first color; and
a second light-emitting device module on the first light-emitting device module, the second light-emitting device module having a first pixel penetration hole overlapping the second pixel region, the second light-emitting device module further comprising a second light-emitting device overlapping the second pixel region to display a second color different from the first color,
wherein the first non-emission layer and the first light-emitting layer constitute a single integrated body.

2. The display apparatus of claim 1, wherein the first light-emitting device further comprises a first pixel electrode and a first opposite electrode opposite to the first pixel electrode, the first light-emitting layer being between the first pixel electrode and the first opposite electrode,
the first non-emission layer not overlapping the first pixel region.

3. The display apparatus of claim 2, wherein the first non-emission layer comprises a first material different from a second material of the first light-emitting layer.

4. The display apparatus of claim 2, wherein a first material included in the first non-emission layer and a second material included in the first light-emitting layer have molecular structures that are different from each other.

5. The display apparatus of claim 2, wherein the first non-emission layer encloses the first light-emitting layer, when viewed in a plan view.

6. The display apparatus of claim 2, wherein the first light-emitting device further comprises a first protection layer, the first protection layer being located on the first opposite electrode and comprising an insulating material.

7. The display apparatus of claim 2, wherein a second pixel penetration hole overlapping a third pixel region is in the first light-emitting device module.

8. The display apparatus of claim 7, wherein the first light-emitting device module further comprises a first substrate located below the first light-emitting device to support the first light-emitting device, wherein the second pixel penetration hole penetrates the first substrate.

9. The display apparatus of claim 2, wherein the first non-emission layer overlaps the second pixel region.

10. The display apparatus of claim 2, wherein
the circuit device layer comprises a transistor connected to the first light-emitting device module, and
the first pixel electrode is connected to the transistor through a pixel contact hole, the pixel contact hole being located outside the first pixel region and penetrating the first light-emitting device module and the second light-emitting device module.

11. The display apparatus of claim 2, wherein the circuit device layer comprises a power voltage pattern configured to receive a reference voltage, wherein the first opposite electrode is connected to the power voltage pattern through an opposite contact hole, the opposite contact hole being located outside the first pixel region and penetrating the first light-emitting device module and the second light-emitting device module.

12. The display apparatus of claim 7, wherein the second light-emitting device module further comprises a second substrate below the second light-emitting device to support the second light-emitting device, wherein the second pixel penetration hole penetrates the second substrate.

13. A display apparatus comprising:
a substrate comprising a first pixel region and a margin region adjacent to the first pixel region;
a circuit device layer on the substrate;
a first light-emitting device module on the circuit device layer, the first light-emitting device module comprising a first light-emitting device overlapping the first pixel region to display a first color, the first light-emitting device module further comprising a first non-emission layer overlapping the margin region; and
a second light-emitting device module on the first light-emitting device module, the second light-emitting device module having a first pixel penetration hole overlapping a second pixel region, wherein the first light-emitting device comprises a first pixel electrode, a first opposite electrode opposite to the first pixel electrode, and a first light-emitting layer between the first pixel electrode and the first opposite electrode, and wherein the first non-emission layer and the first light-emitting layer constitute a single integrated body.

14. The display apparatus of claim 13, wherein the first non-emission layer comprises a first material different from a second material of the first light-emitting layer.

15. The display apparatus of claim 13, wherein a first material included in the first non-emission layer and a second material included in the first light-emitting layer have molecular structures that are different from each other.

16. The display apparatus of claim 13, wherein the substrate further comprises the second pixel region spaced from the first pixel region, and the second light-emitting device module comprises a second light-emitting device overlapping the second pixel region and configured to display a second color different from the first color.

17. A method of manufacturing a display apparatus comprising:

placing a substrate comprising a first pixel region and a second pixel region adjacent to the first pixel region, on a support substrate;

forming a penetration hole, overlapping the second pixel region, in the substrate;

forming a first pixel electrode on the substrate;

depositing a light-emitting pattern on the first pixel electrode;

irradiating a first light onto a portion of the light-emitting pattern to form a first light-emitting layer, the light-emitting pattern not overlapping the first pixel region, the first light-emitting layer overlapping the first pixel region, and a first non-emission layer not overlapping the first pixel region;

forming a first opposite electrode on the first light-emitting layer and the first non-emission layer; and separating the support substrate from the substrate.

18. The method of claim 17, wherein the first light has a wavelength of 300 nm or shorter.

19. The method of claim 17, wherein a molecular structure of a first material in the first light-emitting layer is different from a molecular structure of a second material in the first non-emission layer.

20. The method of claim 17, wherein the forming of the penetration hole in the substrate comprises irradiating the substrate with a laser beam, using a dry etching process, or using a Bosch process.

\* \* \* \* \*